(12) United States Patent
Asbeck

(10) Patent No.: US 10,062,796 B2
(45) Date of Patent: Aug. 28, 2018

(54) PHOTOVOLTAIC SYSTEM, MODULE HOLDER SYSTEM AND REFLECTOR

(71) Applicant: SOLARWORLD INDUSTRIES GMBH, Bonn (DE)

(72) Inventor: Frank Asbeck, Bonn (DE)

(73) Assignee: SOLARWORLD INDUSTRIES GMBH, Bonn (DE)

( * ) Notice: Subject to any disclaimer, the term of this patent is extended or adjusted under 35 U.S.C. 154(b) by 198 days.

(21) Appl. No.: 14/926,768

(22) Filed: Oct. 29, 2015

(65) Prior Publication Data

US 2016/0141437 A1 May 19, 2016

(30) Foreign Application Priority Data

Nov. 17, 2014 (DE) .................... 20 2014 105 516 U

(51) Int. Cl.

| | |
|---|---|
| *H01L 31/056* | (2014.01) |
| *H02S 20/00* | (2014.01) |
| *H02S 40/22* | (2014.01) |
| *H02S 40/10* | (2014.01) |
| *H01L 31/068* | (2012.01) |
| *H02S 20/10* | (2014.01) |

(52) U.S. Cl.
CPC ........ *H01L 31/056* (2014.12); *H01L 31/0684* (2013.01); *H02S 20/00* (2013.01); *H02S 20/10* (2014.12); *H02S 40/10* (2014.12); *H02S 40/22* (2014.12); *Y02E 10/52* (2013.01)

(58) Field of Classification Search
CPC ............... H01L 31/0547; H01L 31/068; H01L 31/0684; H02S 20/00
See application file for complete search history.

(56) References Cited

U.S. PATENT DOCUMENTS

| | | | | |
|---|---|---|---|---|
| 5,538,563 | A * | 7/1996 | Finkl | F24J 2/16 136/246 |
| 2012/0247533 | A1* | 10/2012 | Sanzone | H01L 31/0547 136/246 |
| 2013/0199609 | A1* | 8/2013 | Snidow | H01L 31/0508 136/256 |
| 2014/0216521 | A1* | 8/2014 | Bracken | H01L 31/0527 136/246 |

* cited by examiner

*Primary Examiner* — Bethany L Martin
(74) *Attorney, Agent, or Firm* — Oliff PLC

(57) ABSTRACT

A photovoltaic system has at least two bifacial solar modules, which are respectively held in a module holder, and a reflector. The module holders are configured to hold two bifacial solar modules vertically positioned and parallel to each other, wherein the module holders are interconnected via the reflector.

18 Claims, 16 Drawing Sheets

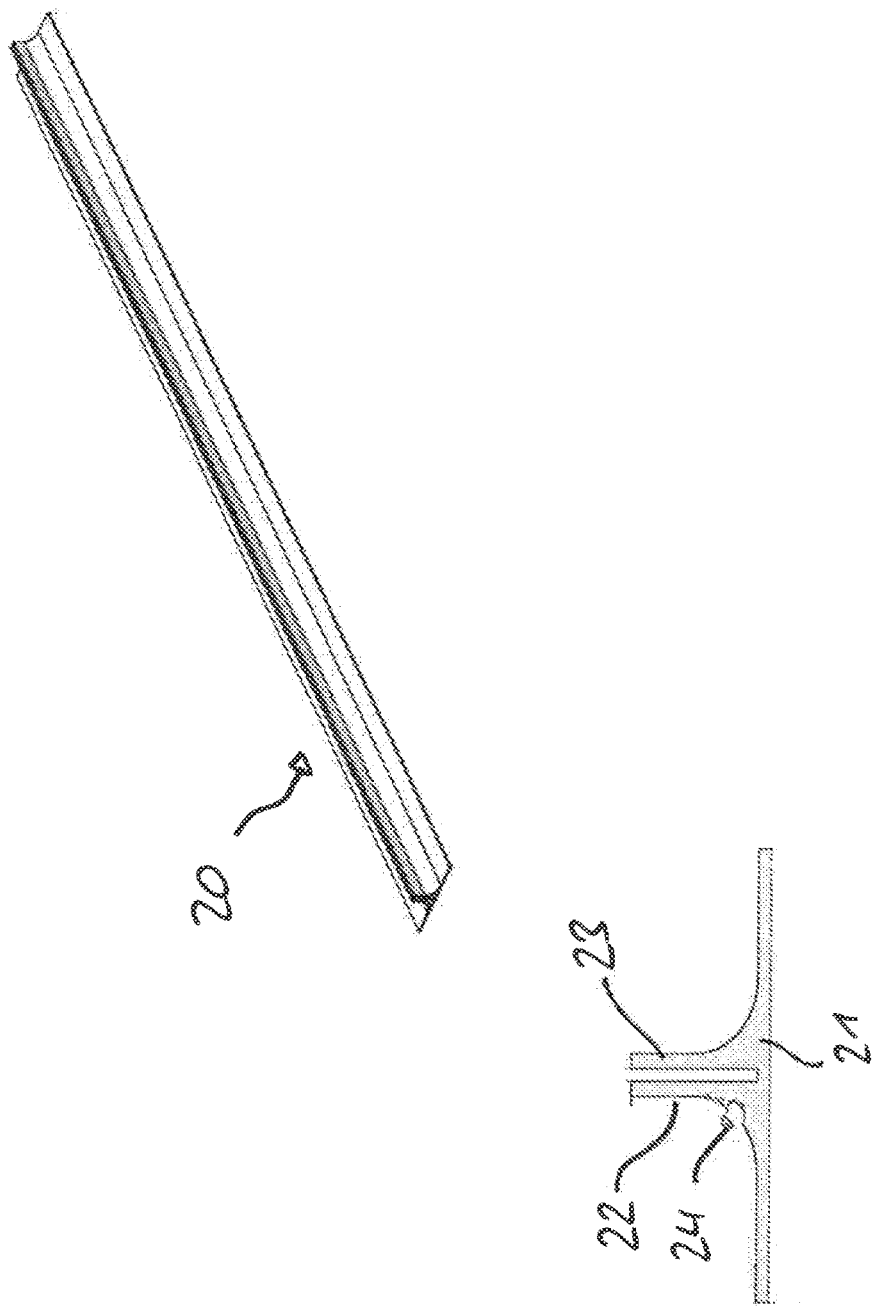

PHOTOVOLTAIC SYSTEM, MODULE HOLDER SYSTEM AND REFLECTOR

The invention relates to a photovoltaic system with at least two bifacial solar modules, which are respectively disposed in a module holder, and a reflector. The invention relates further to a module holder system and a reflector for such a photovoltaic system.

Photovoltaic systems, hereinafter also referred to as PV systems, convert sunlight into electrical energy by means of solar cells. In PV systems, the solar cells are disposed on solar modules, which in turn are interconnected to the solar generators. Larger PV systems are generally configured as ground-mounted systems, in which the solar modules are placed in rows on suitable supporting substructures at shadow-free distance from each other.

To obtain a highest possible power yield in PV systems, the solar modules are placed inclined, adapted to the respective latitude and oriented towards the midday solar peak and maximum radiation, in the northern hemisphere facing south, in the southern hemisphere facing north, at the equator almost horizontal. Such PV systems provide an exceptional maximum power yield at midday, which results in a significant grid-supply and thereby to grid load, whereas the power yield in the morning or evening is marginal.

To broaden the diurnal cycle curve and to increase the power yield of PV systems, single or double axis tracking systems can be used, however which substantially increases the production costs and the operational costs of the PV system.

Alternatively, stationary reflectors can be used in PV systems, to increase the power yield. Thus, a PV system with inclined disposed solar modules are proposed in DE 10 2009 051 766 B1, wherein reflectors are provided between two Module rows, which interconnect the module rows in a stepped manner.

Generally, the solar cells have a mono-facial light sensitive surface. In addition to such single-sided light sensitive solar cells, bifacial solar cells are also increasingly used, in which the light incident on the front side as well as the rear side can be used for power generation.

A PV system with bifacial solar modules is described in EP 2 669 596 A1. Therefore, the bifacial solar modules are successively disposed in a suspended structure, wherein the holding elements of the bifacial solar modules are configured rotatable, in order for the bifacial solar modules to track the position of the sun above the horizon and/or to reduce the wind pressure of the modules. Therefore, the support structure of the solar modules is very complex.

Further, a PV system with inclined disposed partially transparent bifacial solar modules is known from DE 20 2005 007 833 U1, wherein the solar modules are mounted with a distance above the floor and a reflector is disposed under the modules, to reflect the sunlight on the light sensitive bottom side of the modules. Even here, a complex substructure is necessary for the solar modules.

In all PV systems, which are the stationary or trackable and are oriented with or without reflector for maximum power yield, however, an excellent midday peak occurs during the power generation, which results in a high grid load or necessitates an expensive electricity buffering.

Further, because of dirt and precipitation, there are deposits in horizontal or inclined disposed solar modules, which should be elaborately cleaned or which reduce the power yield.

It is the object of the invention to provide a PV system and a module holder system and a reflector for such a PV system, which can be manufactured cost-effectively, is distinguished by a lower assembly and maintenance cost and in addition, ensures a broadening of the diurnal cycle curve during power generation.

This object is accomplished by the disclosed photovoltaic module, by the disclosed a module holder and by the disclosed reflector.

In accordance with the invention, in a photovoltaic system, two bifacial solar modules are respectively mounted in an associated module holder. The module holder is configured such that the two bifacial solar modules are disposed vertically and mutually parallel, wherein a reflector is disposed between the module holders.

Die vertical arrangement of the bifacial solar modules leads to a simplified mounting and thereby to a reduction of the assembly costs. Furthermore, deposits on the module surfaces, which are expensive to be cleaned, are avoided by the vertical positioning of the solar modules.

In addition, the use of vertically positioned bifacial solar modules broadens the diurnal cycle curve during power generation. For this purpose, the PV system is preferably positioned such that the light incident surfaces of the vertically positioned solar modules are oriented towards east or west. With the reflector disposed between the two vertically positioned bifacial solar modules, additional light radiations are directed towards the light sensitive surfaces of the solar modules, whereby the power yield can be increased substantially. If the reflectors interconnect the module holders, this additionally ensures an increased stability of the PV system and in particular, prevents a toppling over of the vertically positioned bifacial solar modules.

According to an embodiment, the bifacial solar modules are configured without frame, wherein the module holder has a support element with two respective parallel holding surfaces, between which the vertically positioned bifacial solar module is disposed. Preferably, the bifacial solar modules are therefore configured such that a border area provided for holding is free from solar cells. This solar cell free border area of the bifacial solar modules is particularly suitable for arranging a module attachment. Preferably, even a DC converter or a module inverter can be provided in or near the module attachment. The frameless solar modules with the border area free from solar cell for vertical holding in the module holders can be manufactured cost-effectively. The use of the module holder with parallel holding surfaces further reduces the assembly cost during mounting of the solar modules on the module holder. Therefore, the solar modules can be fixed between the parallel holding surfaces by a screw-clamping and/or can be fixed by an adhesive, e.g. an adhesive tape or a UV-stable adhesive compound.

According to an embodiment, the module holder is a profile element with a slit-shaped entry for the solar module, fixed in ground, for example by ground anchors or hanger bolts, preferably manufactured in an injection moulding, casting or extrusion forming process from Aluminum or plastic or from steel, manufactured in rolling or forging process or by welding of semi-finished products. A bifacial solar module with its cell-free lower border area is inserted and held in the slit-shaped entry of the module holder. Such module holder can be easily produced and furthermore, guarantees a simple assembly of the bifacial solar modules.

Generally, the solar modules are disposed side by side in a row. Therefore, the outer edges of the solar modules preferably do not touch. This can possibly be achieved by spacers, which are integrated in the module holders.

Generally, the positioning of the solar modules is done on a substantially horizontal ground, for example soil, a flat roof. In this case, the parallel holding surfaces make an angle of 90 degrees with respect to the platforms of the module holder. Minor unevenness and inclinations of the ground can be compensated by distance pieces under the platforms. For larger inclinations, for example on a hillside plot, special module holders with a diverging angle of inclination of the parallel holding surfaces with respect to the platforms are possible.

The parallel holding surfaces extend at least 2 cm and in a vertical direction. The platforms extend at least respectively 5 cm in the directions opposed from the base of the module holder. The slit-width of the parallel holding surfaces is between 3 mm and 15 mm.

The outer side of the holding surface and platform can be configured likewise as a reflector integrated in the module holder.

A substantially horizontally extending channel for entry of the module connection wires can be provided in the module holder, whereby a secure module attachment can be obtained. A horizontally extending edge of the module holders can additionally be used as guiding edge for a self-propelled inspection or cleaning device, which enables a simplified maintenance of the PV system.

According to another embodiment, the module holder is a side profile with a groove like entry for a solar module, vertically anchored in or on the ground, preferably manufactured in an injection moulding, casting or extrusion-forming process from Aluminum or plastic or from steel, preferably manufactured in rolling or forging process or by welding of semi-finished products.

The side profile can be fixed on the ground by ground anchors or hanger bolts or rammed or casted in concrete into the ground. Such side profiles can similarly be produced and positioned easily. In addition, a simple assembly of the bifacial solar modules is guaranteed by the slit-shaped entry.

Preferably, such a post-shaped side profile has two opposed groove-like entries, to hold two adjoining solar modules. A solar module is screwed into the groove-like entry of two side profiles and held on the side edges of the solar module. A cell-free border area can be available on the lower module edge and/or on one or both lateral module borders, however, not necessary in this embodiment, particularly when the solar modules are positioned upright and the groove-like entries enclose a larger area of the lateral edges of the solar module. An additional safety of the solar modules from a movement against the shear force can be provided, for example by clamping bolts, an adhesive or an anti-theft device; however, is not essential.

The width of the reflector disposed between the module holders is preferably selected such that no shadow from the solar modules occurs. In case, this is not possible, the solar modules can have a DC-converter or a module inverter, which are preferably disposed in the cell-free border areas of the solar module. Therefore, the reflector can be configured self-propelled, which reduces the manufacturing as well as assembly costs. Alternatively, the reflector can also include a reflector support, which interconnects both the adjoining module holders. By such a joint of the module holders via reflector support, the mechanical stability of the PV system can be improved in particular.

To increase the power yield of the PV system, the reflector has two surfaces making an angle. By these angled surfaces, a targeted reflection of the light radiation can be obtained on the light incident surfaces of the bifacial solar modules, particularly when the sun is near its maximum radiation.

Preferably, the two angle making surfaces of the reflector are equal in size, thus to obtain a uniform distribution of the reflected light radiation on both these solar modules. Nevertheless, it is also possible to configure one of the two reflector surfaces larger, e.g. to compensate the less yield of one side of the bifacial solar module.

In such a case, the reflector surfaces are respectively disposed ascending in pitched roof shape at the center between two parallel solar modules and are spaced apart from the solar modules. Alternatively, it can also be provided that the two angle making surfaces of the reflector are spaced apart from each other and sloping toward the center and respectively border the module holder on a bifacial PV-Module. With this design also, a uniform distribution of the reflected radiation can be obtained on the adjoining bifacial solar modules, wherein the inclined reflector surfaces in the region of the module holders can ensure an additional stability of the structure.

The invention is described in more details with the help of the accompanying drawings.

FIG. 13 shows a module holder in cross-section and in a perspective view;

The figures show possible embodiments of a PV system, which consists of parallel rows of vertically positioned bifacial solar modules. The solar modules in turn consist of a plurality of electrically interconnected solar cells, which are light sensitive on the front-side as well as on the rear-side. Therefore, the solar modules are preferably configured as laminated glass-glass modules, which are distinguished by a high robustness and a long service life. However, there is also a possibility to use other types of solar module.

The solar modules are preferably configured without frame, wherein a solar cell free border area can be provided. The solar modules particularly have a square or rectangular shape, wherein the cell-free border area is disposed on the lower side during the use of a module holder. In the cell-free border area of the solar module, preferably the connection socket of the solar module is disposed with the bypass diodes and the cable connectors. Additionally, a DC-converter or a module inverter can be provided near or in the connection socket.

The rows of solar modules of the PV system are preferably oriented in north-south direction, so that the light sensitive front and rear sides of the solar cells in the solar modules are oriented towards east or west. With one such positioning, there is a possibility to obtain a higher power yield in the forenoon and afternoon and thus in comparison to the conventional PV system oriented towards south to avoid significant midday peaks during power generation which can result in higher grid loads or necessitate expensive energy storage. In addition, the vertical arrangement of the bifacial solar modules reliably prevents deposits on the module surface, whereby the cleaning costs can be reduced.

The parallel rows of vertically positioned bifacial solar modules can be disposed as ground-mounted systems or even on other plane surfaces, e.g. flat roofs or parking lots. There is also a possibility to design the floating PV system. Therefore, support elements are used as module holders, which hold the bifacial solar modules vertically positioned. The module holders can be mounted on the floating bodies in a floating design of the PV system.

The module holder has two parallel holding surfaces, between which the bifacial solar modules with their cell-free border areas are disposed. Therefore, the solar modules can be permanently or detachably fixed between the parallel holding surfaces. Therefore, the fixing can be done by an adhesive, e.g. an adhesive tape or a UV-stabilized adhesive compound. Alternatively, even a detachable screw-clamped joint can be provided. Instead of an independent clamping device, the clamping effect can also be obtained directly by the holding surfaces of the support element by corresponding dimensioning in terms of height and distance.

Figure 1:
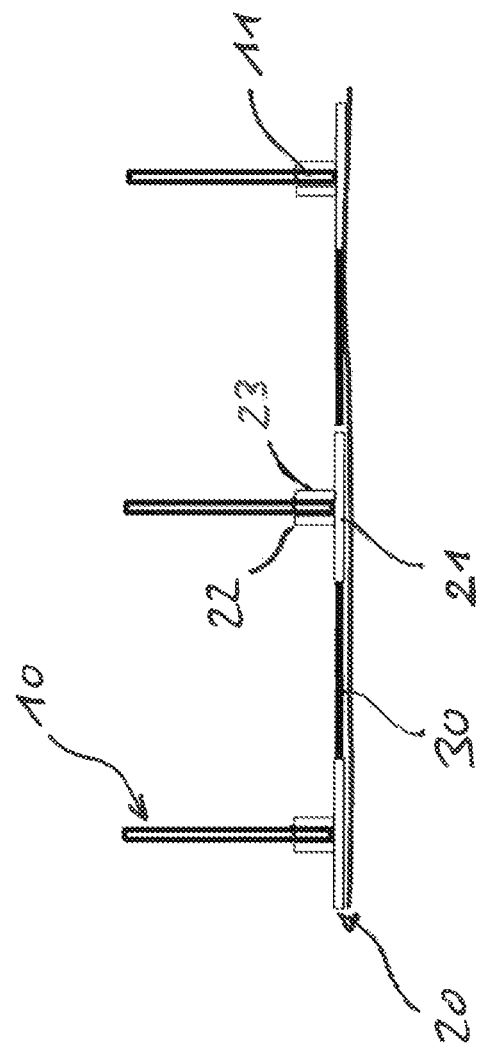
FIGS. 1 and 2 show a first embodiment of the PV system, highly schematically in cross-section and in top view.
Figure 2:
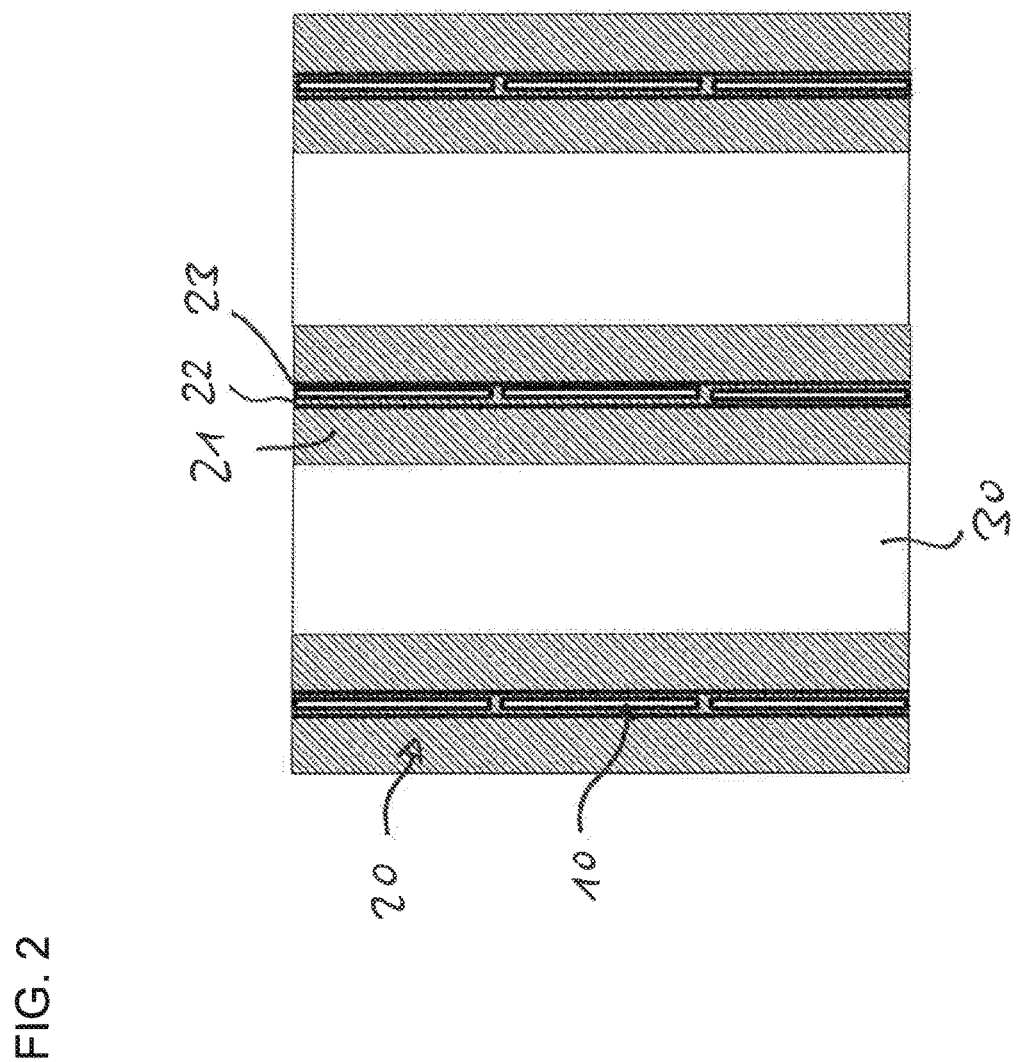

FIGS. 1 and 2 show in highly schematic representation, a possible design of the PV system with rows of mutually parallel disposed bifacial solar modules 10, which are vertically positioned and are supported by a module holder 20 disposed on a floor. As the cross-section in FIG. 1 shows, the module holder 20 is configured as standard profile with a platform 21, which centrally supports two parallel holding surfaces 22, 23. Between both the holding surfaces, the bifacial solar module 10 is disposed, which is fixed between both the holding surfaces by its cell-free border area 11. In FIGS. 1 and 2, three parallel disposed module holders 20 are provided, which respectively hold three solar modules 10, as the top view in FIG. 2 shows.

FIG. 13 shows a possible configuration of the module holder 20 as standard profile in cross-section and in the perspective top view. The standard profile is preferably manufactured by means of an extrusion-forming process, from Aluminum or plastic. Alternatively, however, galvanized steel can also be used as the material. The module holder is preferably integrally configured with a broadened joint section between the platform 21 and both the parallel holding surfaces 22, 23, to obtain an increased stiffness. Alternatively, the module holders can consist of two semi-finished products, which are held together by screw connection and therefore simultaneously clamp the solar modules between both the parallel holding surfaces by means of force-fit or form-locking.

In the configuration as shown in FIGS. 1 and 2, the module holders with their platform are fixed on the ground. However, there is a possibility to provide an additional fixing device on the module holder, e.g. a ground anchor disposed in the region of the platform. On the outer side or under the holding surface 22, a predominantly horizontally extending channel 24 can be configured for the entry of module connection wires. In the holding surface 22, one or more slot can further be provided for the module connection socket and a DC-converter or module inverter. Furthermore, one of the holding surfaces 22 or 23 can have a horizontally extending guiding edge for a self-propelled cleaning device.

To increase the power yield, one or more reflectors are disposed between two vertically parallel solar modules. For an improved stability of the PV system, the mutually parallel disposed module holders can be connected. Therefore, the reflector is configured such that it mainly directs the light radiation incident from above towards the vertical light sensitive surfaces of a bifacial solar module. FIGS. 1 and 2 show a configuration, in which a reflector 30 is configured as a flat rectangular panel, which is disposed between the module holders 20 and joined to this. Therefore, the reflector 30 can be configured self-propelled, as shown in FIGS. 1 and 2. Preferably, the reflector is a flat surface or a surface provided with engraved structures, which is produced from, e.g. plastic, Aluminum, steel, glass or ceramic. The engraved structures can be ripples, trenches, honeycombs, beads, dimples or the like. Instead of a flat surface, the reflector can also be formed concave or parabolic.

Alternatively, a substructure can also be provided for the reflector, which interconnects the module holders and is applied on a reflecting surface, e.g. in the form of a textile material. The substructure can also be a carrying structure that is laid on the ground.

Therefore, the surface of the reflector can be configured, in principle, as diffuse reflecting surface, preferably with a high Albedo. Alternatively, a reflecting surface can also be provided. Further, structuring elements, such as ripples, beads, dimples or honeycombs can also be disposed on the surface of the reflector, by which an improved light reflection can be obtained towards the light sensitive surfaces of the vertically positioned bifacial solar modules. The reflection characteristics of the surface can also be improved by an additional coating.

The reflector 30 can be configured integrally, as FIG. 2 shows and is extended over the entire space between two parallel solar modules or the entire length of the module holder 20. Alternatively, there is also possibility of assembling the reflector from several elements. Therefore, the reflector is joined to the respective adjoining module holders by its long side, whereby an increased stiffness of the PV system structure can be obtained. Therefore, the joint between the reflector long sides and the module holders can be made via a joint of the edge of the platform 21 of the module holder 20 with the edge of the reflector sheet, as shown in FIG. 1. Therefore, the joint can be configured permanent or detachable, wherein additional connection elements such as screw connections can be provided. Alternatively, however, the reflector sheet can also be disposed overlapping on the module holder and can be fixed there by riveting, screwing or welding. The above explained connection options can also be used during designing of the reflector with a substructure for supporting the reflecting surface.

Figure 3:
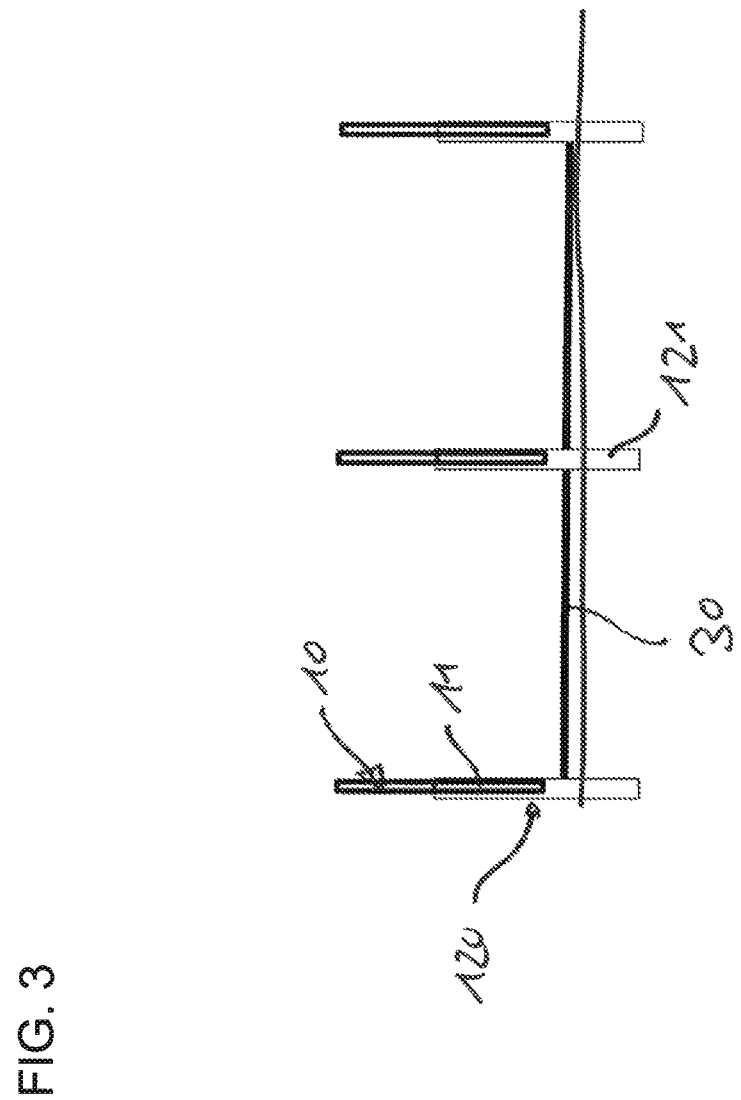
FIGS. 3 and 4 show a second embodiment of the PV system, highly schematically in cross-section and in top view.
Figure 4:
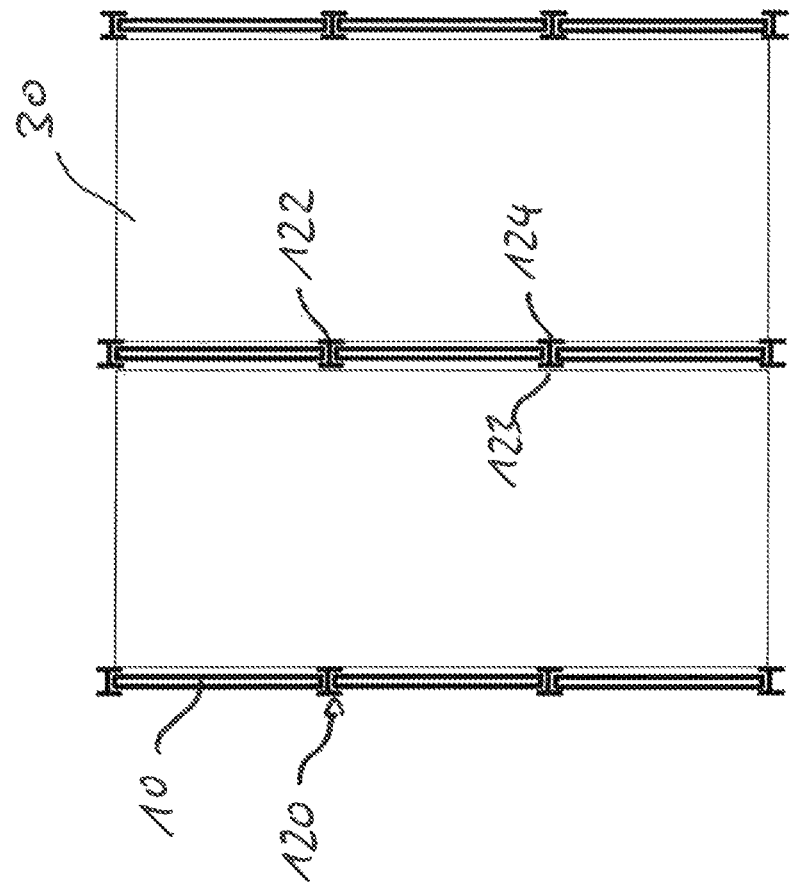

FIGS. 3 and 4 show an alternative configuration of the PV system with a modified module holder construction. As the schematic cross-section in FIG. 3 and the top view in FIG. 4 show, post-like profiles 120 are used as module holders, which have a first section 121 for fixing in the ground and a second section 122 with I-cross-section I or double-T cross-section. Therefore, these profiles of the section 122 laterally enclose the bifacial solar modules 10 by both the parallel holding surfaces 123, 124, wherein each module holder laterally encloses two adjacent solar modules. Therefore, the solar modules can be directly clamped by the holding surfaces 123, 124 of the I-profile section 122 or can also be fixed by means of other connecting means, as these were already explained previously.

Therefore, the individual post-like module holders 120 of a solar module row can also be interconnected via an additional support structure. There is also a possibility to integrally form the first section 121 of the module holder, e.g. in the form of a panel, on which the I- or double-T shaped profile section 122 are mounted for lateral holding of the bifacial solar modules. The post-like module holders 120 can be permanently or detachably connected to the reflectors 30 disposed between the solar module rows or these can have no connection with the reflectors. Therefore, the reflectors 30 or their joint with post-like module holders 120 can be similarly configured as the module holder structure represented in the FIGS. 1 and 2.

Figure 5:
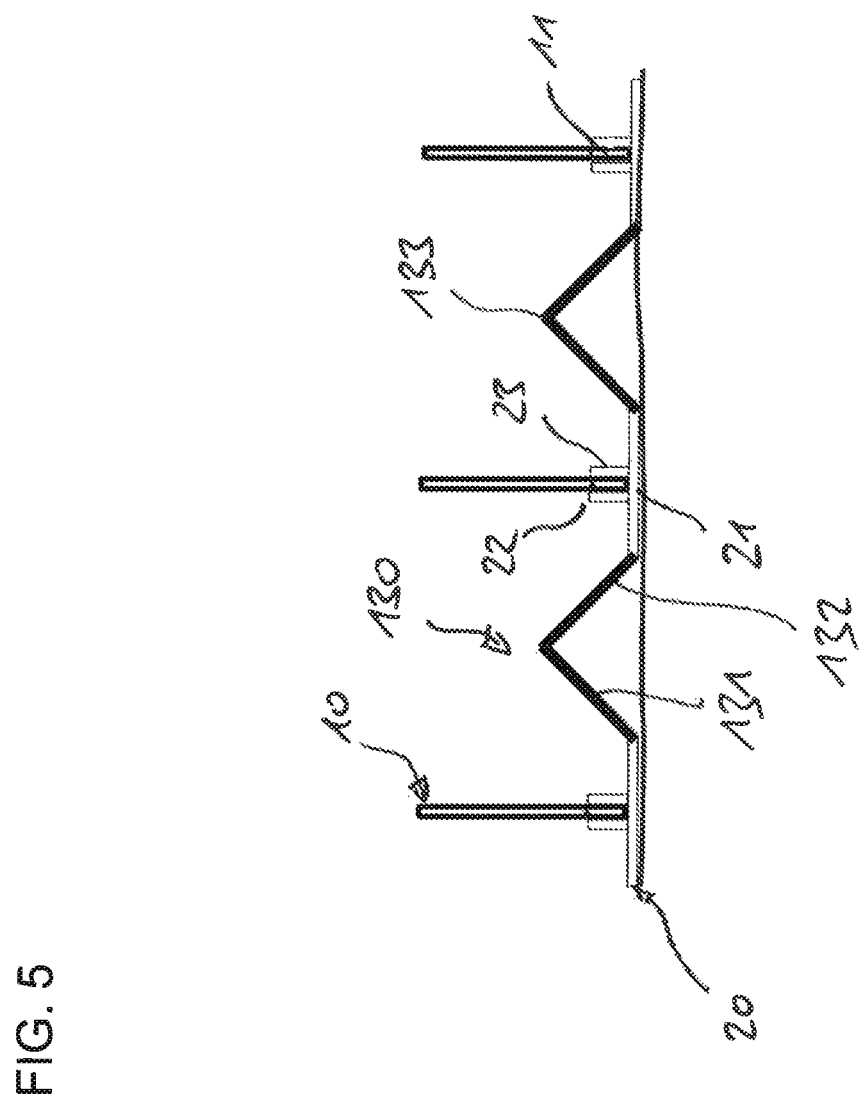
FIGS. 5 and 6 show a third embodiment of the PV system, highly schematically in cross-section and in top view.
Figure 6:
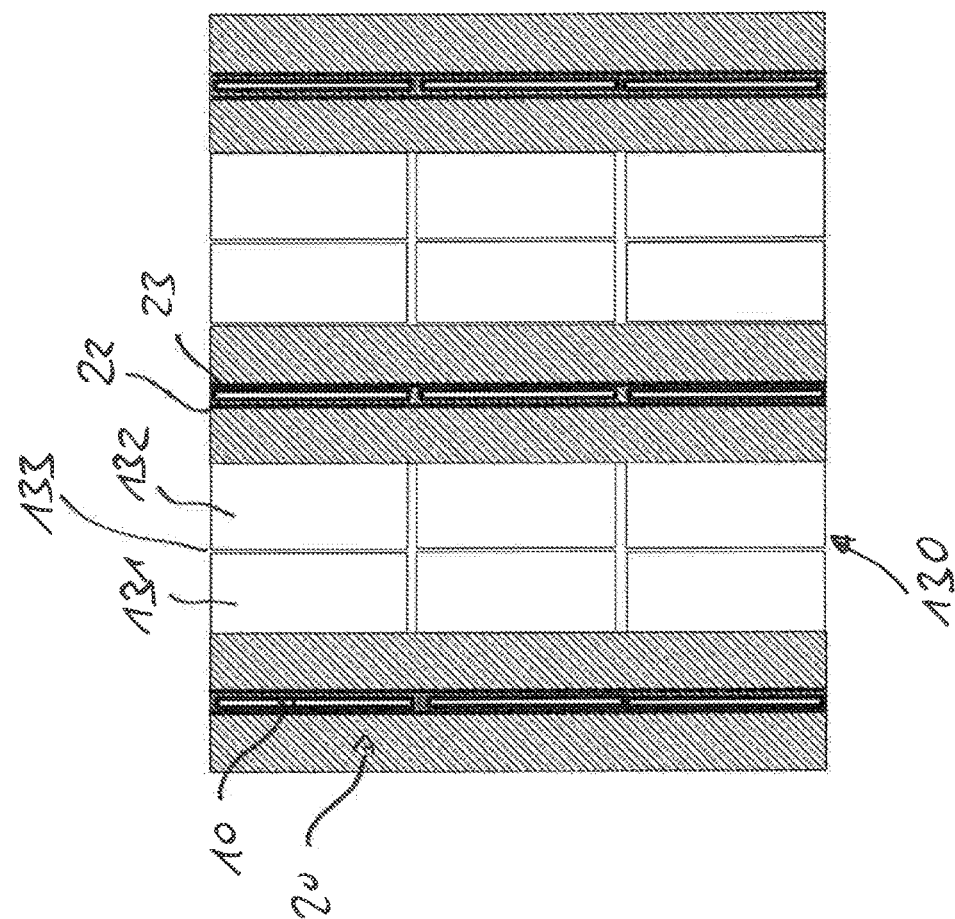

FIGS. 5 and 6 show a modification of the configuration of the PV system with a modified reflector configuration represented in FIGS. 1 and 2. Instead of a horizontal reflector configuration, a reflector 130 has two flat reflector surfaces 131, 132, which make an angle of 90° or more. Therefore, the edge 133 between both the angle making surfaces 131, 132 of the reflectors 130 preferably pass midway between two parallel rows of bifacial solar modules. Alternative to the flat reflector surfaces, there is also possibility to configuration the reflector surfaces with a concave or parabolic surface. For example, the reflector surfaces can be configured in the shape of parabolic mirror or parabolic troughs. The flared parabolic troughs can be oriented such that the reflected sunlight strikes on the PV modules even at significantly changed position of the sun.

By providing the reflector surfaces inclined with respect to the ground, there is a possibility to improve the reflection characteristics and to ensure an increased light reflection on the vertically positioned bifacial solar module rows. The reflector 130 shown in FIGS. 5 and 6 is configured self-supporting similar to the reflector in the FIGS. 3 and 4. It can also be provided with a substructure. The reflector 130 can be joined in the same manner as the reflector with the laterally adjacent module holders 20 shown in the FIGS. 3 and 4. As the top view in FIG. 6 shows, the reflector 130 can consist of individual surfaces, which are permanently interconnected, e.g. via welding joints. However, it can also be formed as continuous surface.

Figure 7:
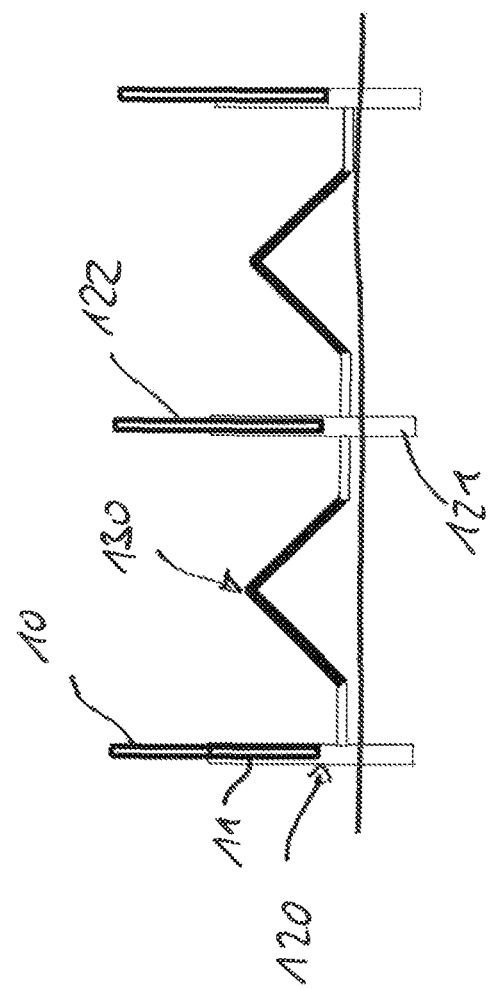
FIGS. 7 and 8 show a fourth embodiment of the PV system, highly schematically in cross-section and in top view.
Figure 8:
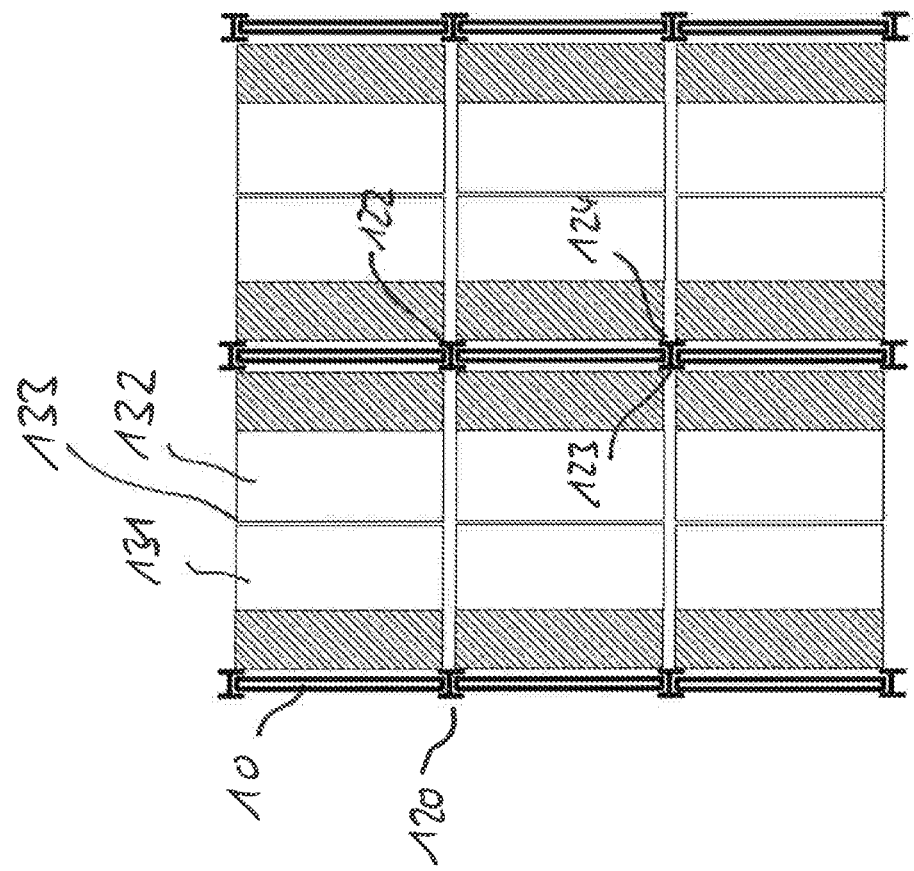

In the FIGS. 7 and 8, an embodiment of the PV system is shown, in which the reflector configuration shown in FIGS. 5 and 6, is joined to the module holders, as it can be used in the configuration shown in FIGS. 3 and 4.

Figure 9:
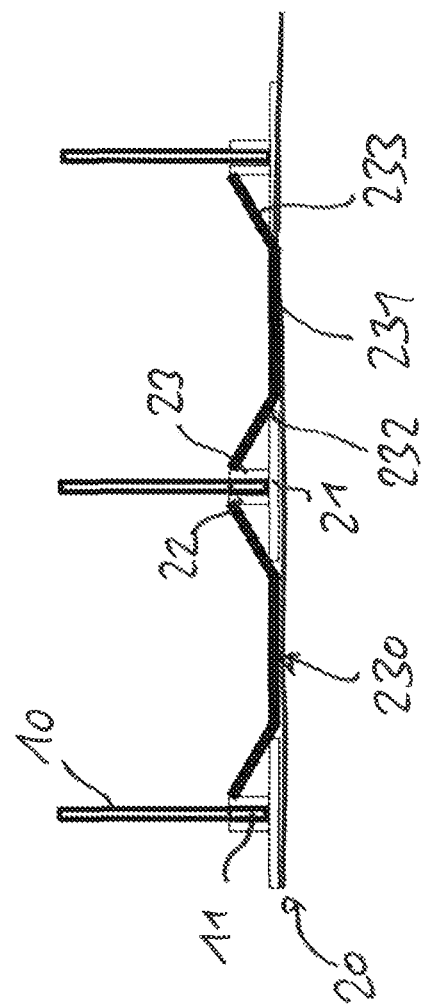
FIGS. 9 and 10 show a fifth embodiment of the PV system, highly schematically in cross-section and in top view.
Figure 10:
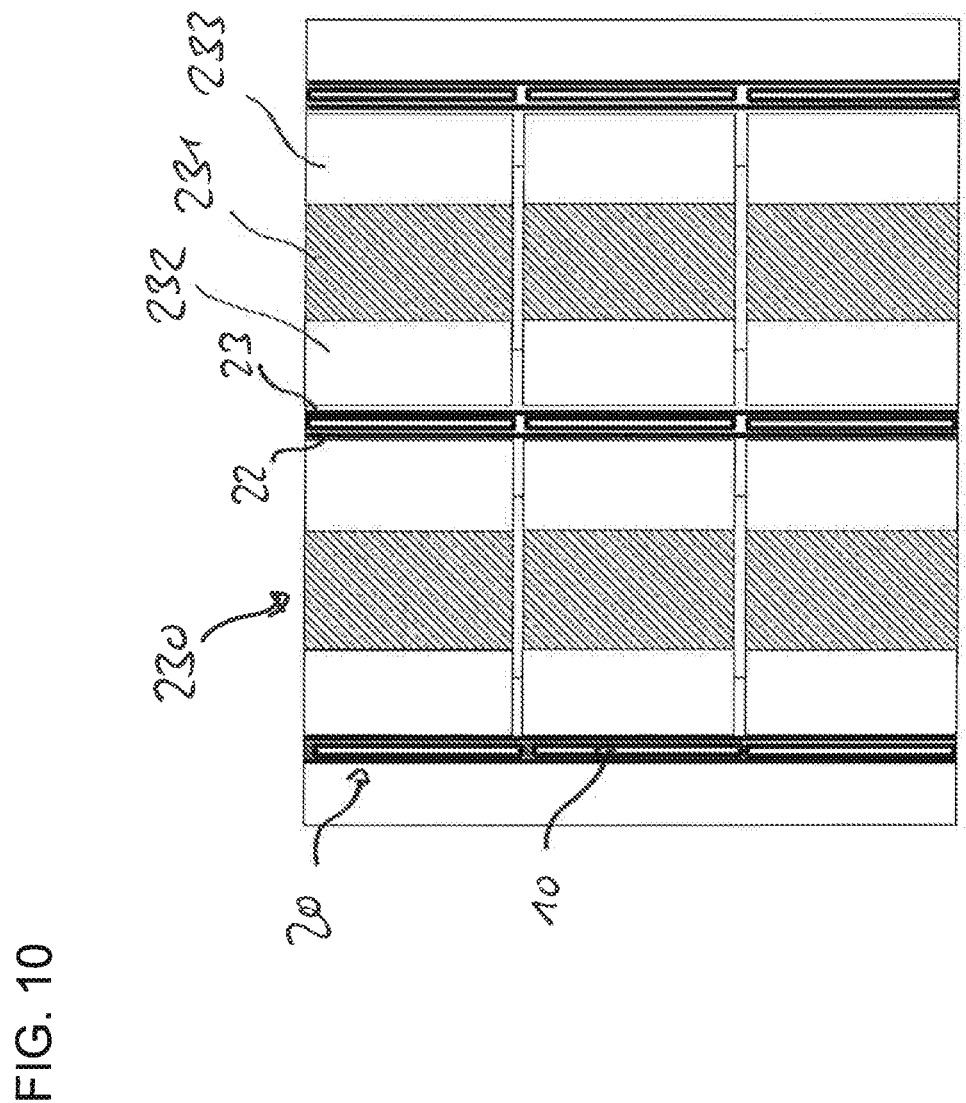

FIGS. 9 and 10 show another variant of the reflector configuration, in which a reflector 230 has a trough-shaped profile in the cross-section with a flat middle surface 231 and two laterally protruding inclined surfaces 232, 233. The inclined surfaces 232, 233 have an angle of inclination of 45° or lesser with respect to the ground and ensures an improved reflection of the light radiation on the opposite vertically positioned bifacial solar modules. Alternative to an angular surface joint between the flat middle surface 231 and both the lateral surfaces 232, there is also a possibility to provide a continuous reflector surface with a concave profile.

Therefore, the reflector surface can be reduced on both the laterally inclined surfaces 232, 233. The middle flat surface 231 of the reflector 230 should have no reflection characteristics and can be used, e.g. for accessing the PV system within the scope of installation and maintenance works. The reflector surfaces can be configured integrally or consist of separate surfaces, which are interconnected. The reflector can in turn be configured self-supporting or can also be provided with a substructure.

Figure 16:
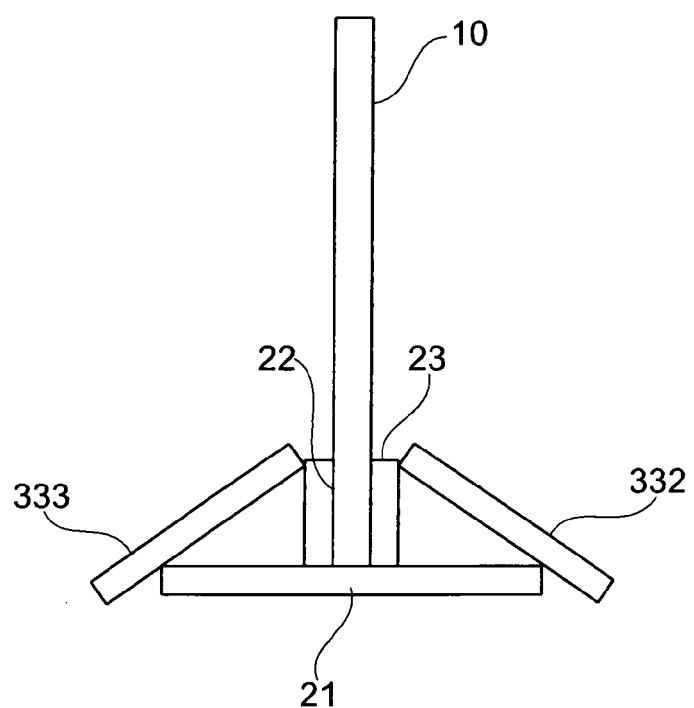
FIG. 16 shows another variant of a module holder in cross-section.

Further, there is a possibility to integrate the laterally inclined surfaces of the reflector in the module holders 20 configured as stands. Therefore, as shown in FIG. 16, both the lateral reflector surfaces 332, 333 extend from the outer edge of the platform 21 of the module holder to the upper edge of the holding surfaces 22, 23.

Figure 11:
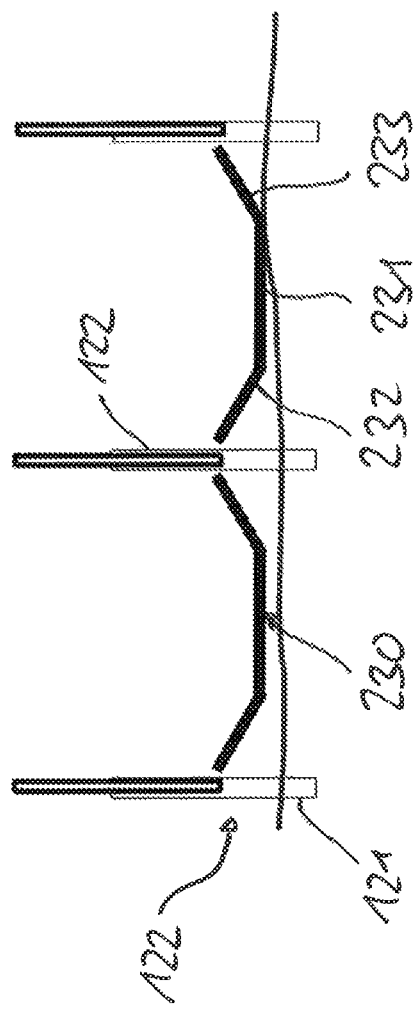
FIGS. 11 and 12 show a sixth embodiment of the PV system, highly schematically in cross-section and in top view.
Figure 12:
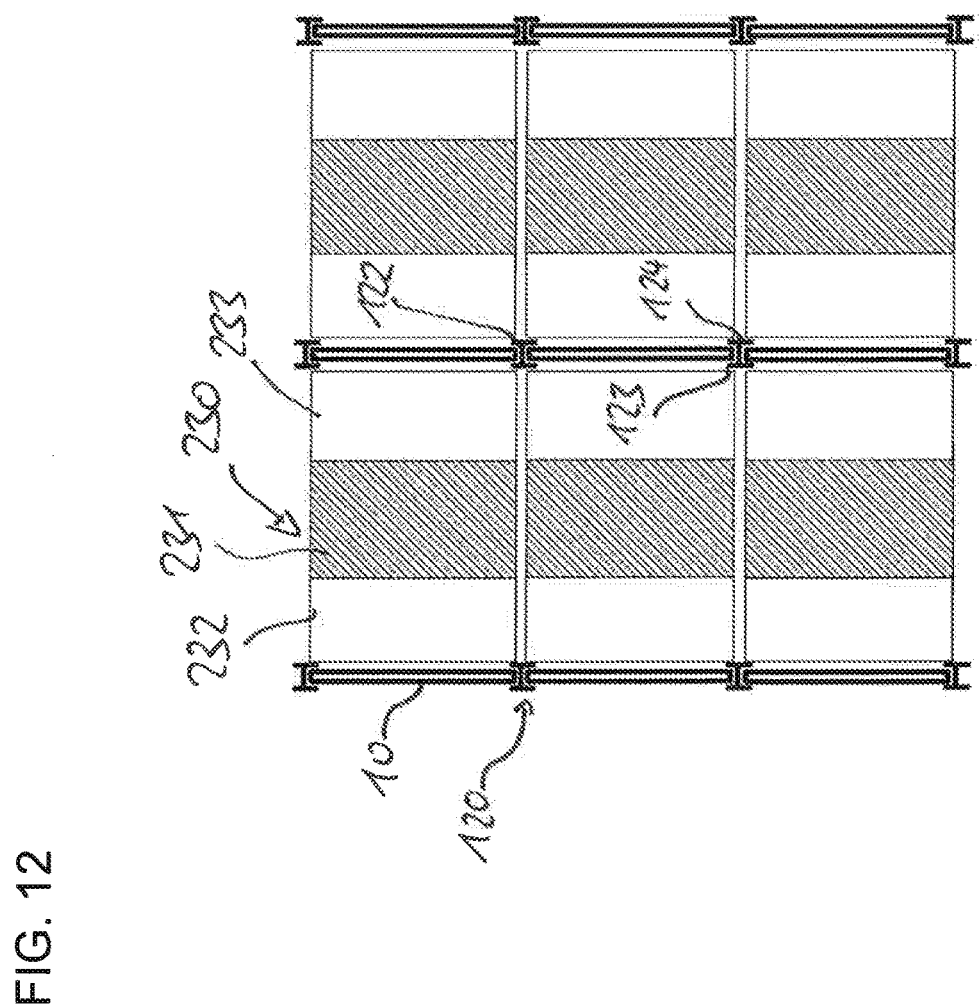
Figure 14D:
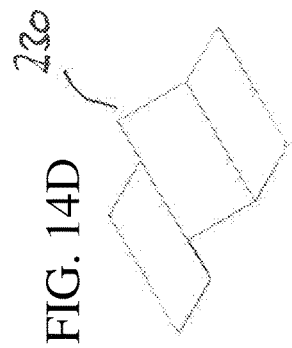
FIGS. 14A-14E show a ground-mounted PV system design with a perspective view and four detailed views.
Figure 14A:
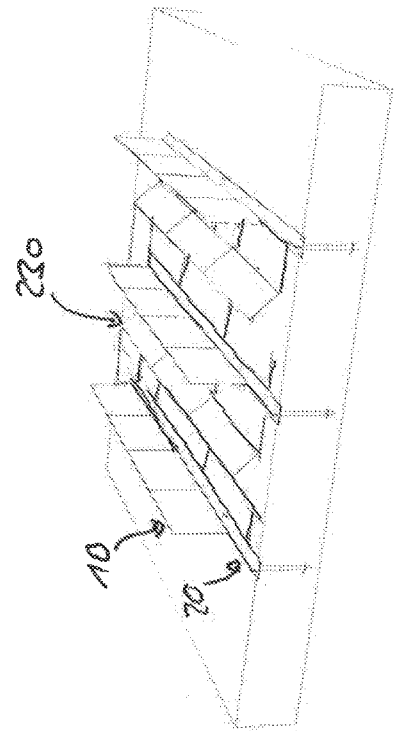
Figure 14E:
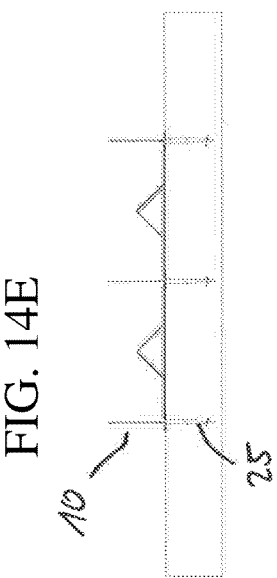
Figure 14C:
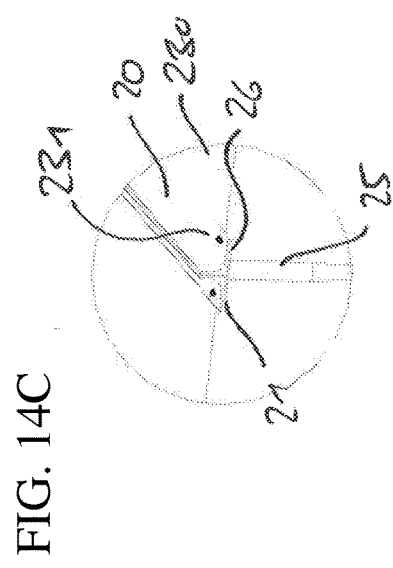
Figure 14B:
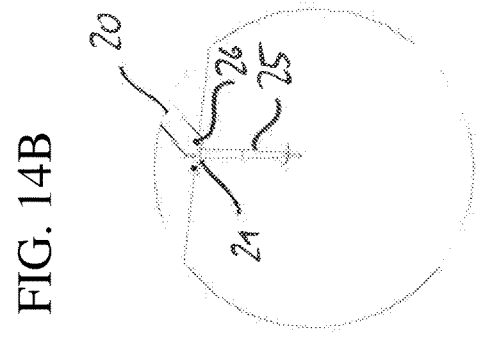
Figure 15D:
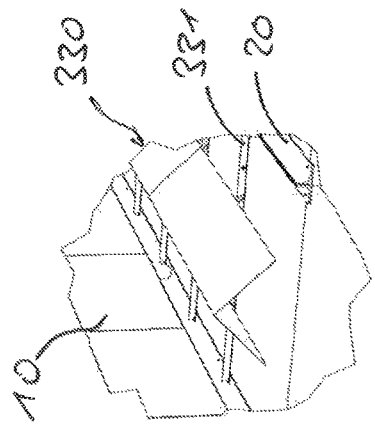
FIGS. 15A-15G show another ground-mounted PV system design with a perspective view and six detailed views.
Figure 15E:
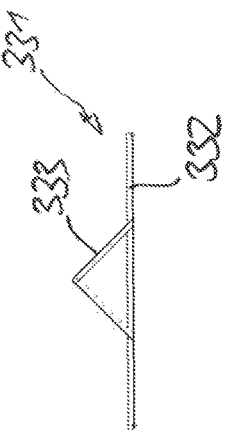
Figure 15C:
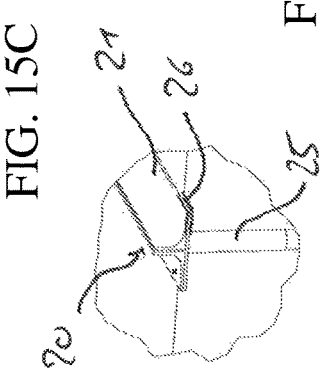
Figure 15A:
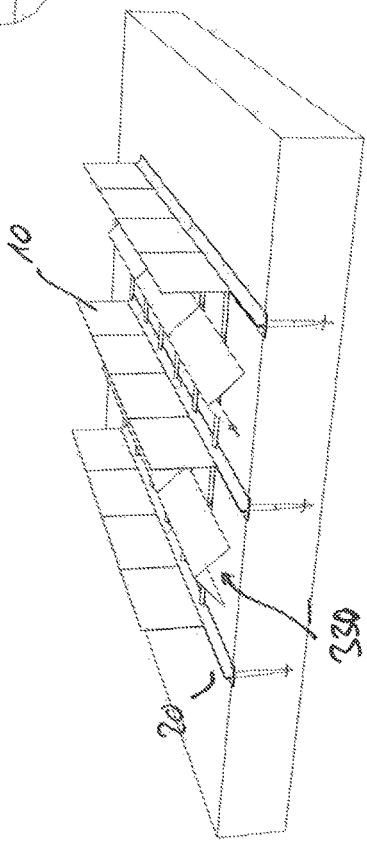
Figure 15F:
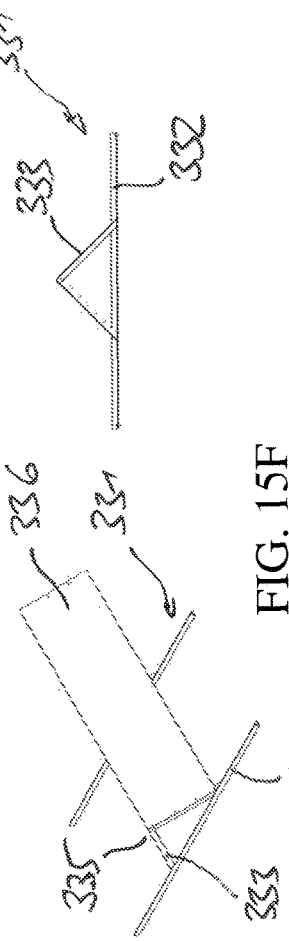
Figure 15B:
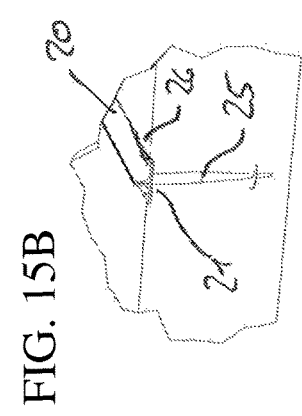
Figure 15G:
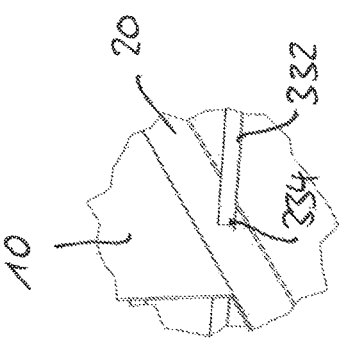

FIGS. 11 and 12 show another variant of the PV system, in which the reflector 230 is shown with the trough shaped profile—as it is explained in connection with the FIGS. 9 and 10—in a module holder configuration as it is used in the FIGS. 3 and 4.

In FIGS. 14A-14E is represented the construction of the PV system based on the construction variant shown in FIGS. 5 and 6, wherein a perspective view A and four detailed views 14B, 14C, 14D, 14E are shown. Therefore, a configuration is used as module holder 20, which is represented in FIG. 13. Therefore, the module holder 20 is fixed—as particularly shown in detailed view B—in ground by a ground anchor 25.

In the configuration shown in FIGS. 14A-14E, a reflector 230 is configured self-supporting and is preferably produced from plastic, Aluminum, Steel, ceramic or glass. The reflector surface is—as the detailed view B shows—fixed by means of rivets 231 on the platforms 21 of the laterally adjacent module holder 20, whereby an additional mechanical support of the module holder is obtained.

FIGS. 15A-15G shows a modification of the PV system shown in FIGS. 14A-14E, wherein a perspective view 15A and six detailed views 15B, 15C, 15D, 15E, 15F, 15G are also represented. In a modification to the embodiment A shown in FIGS. 14A-14E, the reflector 330 has a substructure in the form of reflector supports 331. The reflector supports 331 are Aluminum or steel profiles with a support rod 332 and a triangular attachment 333, as the detailed view 15E shows. The reflector supports 331 are laterally fixed by its support rod 332 on the platforms of the adjoining module holder 20, e.g. by rivets 334, as represented in detailed view 15G. Lateral reflector sheets 335, 336 are disposed on the triangular structures 333 of the reflector supports 331 and are also preferably fixed by rivets or screws. Whereas, the region adjoining the module holder between the platform of the module holder and the triangular structures 333 has no metal sheet and thus enables a simple access to the PV system to carry out maintenance and repair works.

The invention claimed is:

1. A photovoltaic system comprising at least two bifacial solar modules which are respectively held in one or two module holders and a reflector, wherein
    the module holders are configured to hold two of the bifacial solar modules spaced apart, vertically positioned and parallel to each other, and
    the reflector is disposed between the parallel solar modules, wherein the reflector includes a planar central portion that receives incident radiation, a first planar inclined end portion which extends away from a first edge of the central portion, and a second planar inclined end portion which extends away from a second edge of the central portion.

2. The photovoltaic system according to claim 1, wherein one or more of the bifacial solar modules is configured without a frame, and each of the module holders comprises two parallel holding faces, between which one or more the bifacial solar modules is disposed.

3. The photovoltaic system according to claim 1, wherein one or more of the module holders is configured with a slit-shaped entry region.

4. The photovoltaic system according to claim 1, wherein one or more of the module holders comprises a substantially horizontally extending channel for entry of module connection wires.

5. The photovoltaic system according to claim 1, wherein one or more of the module holders forms a horizontally extending guiding edge for a self-propelled cleaning device.

6. The photovoltaic system according to claim 1, wherein the reflector includes a reflector surface comprising a reflecting surface.

7. The photovoltaic system according to claim 1, wherein the reflector includes a reflector surface that is collectively formed concave or concave in subsections.

8. A module holder for bifacial solar modules, wherein the module holder is configured to hold bifacial solar modules vertically positioned, wherein the module holder comprises two reflectors and two respective parallel holding surfaces between which one or more bifacial solar module is disposed, where at least one of the two reflectors is a reflector that includes a planar central portion that receives incident radiation, a first planar inclined end portion which extends away from a first edge of the central portion, and a second planar inclined end portion which extends away from a second edge of the central portion.

9. The module holder according to claim 8, wherein the module holder comprises a slit-shaped entry for the one or more bifacial solar module.

10. The module holder according to claim 8, wherein at least one outer side of the module holder is configured as reflector surface for the one or more bifacial solar module that is vertically positioned and disposed spaced apart in parallel.

11. The module holder according to claim 8, wherein module holder comprises a substantially horizontally extending channel for entry of module connection wires.

12. The module holder according to claim 8, wherein the module holder comprises a horizontally extending guiding edge for a self-propelled cleaning device.

13. A photovoltaic system, which comprises at least two module holders according to claim 8, the at least two module holders being configured to hold bifacial solar modules vertically positioned and parallel to each other, wherein at least one of the reflectors of the at least two module holders is configured for an arrangement between the vertically positioned parallel solar modules.

14. The photovoltaic system according to claim 13, wherein
the one or more bifacial solar module of each of the at least two module holders comprises two bifacial solar modules, and
at least one the reflectors of the at least two module holders is a reflector that comprises two surfaces making an angle, where the two surfaces of the reflector making an angle are disposed contiguous and can be disposed midway between the two bifacial solar modules.

15. The photovoltaic system according to claim 14, wherein the two surfaces of the reflector making an angle are mutually spaced apart and are respectively disposed contiguously on one or more of the two bifacial solar modules.

16. The photovoltaic system according to claim 13, wherein at least one of the reflectors of the at least two module holders comprises a flat reflecting or focussed reflecting surface.

17. The photovoltaic system according to claim 13, wherein at least one of the reflectors of the at least two module holders includes a reflector surface that is formed collectively concave or concave in subsections or parabolic.

18. The photovoltaic system according to claim 1, wherein the reflector comprises a surface that has no reflection characteristics.

\* \* \* \* \*